United States Patent
Taylor et al.

(10) Patent No.: US 9,697,316 B1
(45) Date of Patent: Jul. 4, 2017

(54) SYSTEM AND METHOD FOR EFFICIENT DATA AGGREGATION WITH SPARSE EXPONENTIAL HISTOGRAM

(75) Inventors: Gary Taylor, Dublin (IE); Brian Dennehy, Dublin (IE)

(73) Assignee: Amazon Technologies, Inc., Reno, NV (US)

( * ) Notice: Subject to any disclaimer, the term of this patent is extended or adjusted under 35 U.S.C. 154(b) by 910 days.

(21) Appl. No.: 13/324,911

(22) Filed: Dec. 13, 2011

(51) Int. Cl.
*G06F 17/50* (2006.01)

(52) U.S. Cl.
CPC .................. *G06F 17/5068* (2013.01)

(58) Field of Classification Search
CPC .................. G06F 11/3419; G06F 11/3409
USPC .............. 716/56; 708/490; 709/224
See application file for complete search history.

(56) References Cited

U.S. PATENT DOCUMENTS

| | | | |
|---|---|---|---|
| 6,025,683 A * | 2/2000 | Philipp | H02P 7/2913 318/139 |
| 6,549,910 B1 * | 4/2003 | Tate | |
| 7,889,923 B1 | 2/2011 | Carr et al. | |
| 8,024,458 B1 | 9/2011 | Buragohain | |
| 8,037,430 B2 * | 10/2011 | Papanikolaou et al. | 716/56 |
| 2004/0024801 A1 * | 2/2004 | Hamilton et al. | 708/490 |

* cited by examiner

*Primary Examiner* — Lam Nguyen
(74) *Attorney, Agent, or Firm* — Robert C. Kowert; Meyertons, Hood, Kivlin, Kowert & Goetzel, P.C.

(57) ABSTRACT

Systems and methods for efficient data aggregation with sparse exponential histograms may support a performance monitor monitoring and recording of one or more performance metrics for one of one or more dimensions. In response to receiving performance data, a performance data aggregator may parse the performance data for one of one or more performance metrics and one or more dimensions. A sparse exponential histogram generator may create a sparse exponential histogram with the parsed performance data. The sparse exponential histogram generator may transmit or store the sparse exponential histogram representation for subsequent analysis.

23 Claims, 10 Drawing Sheets

SYSTEM AND METHOD FOR EFFICIENT DATA AGGREGATION WITH SPARSE EXPONENTIAL HISTOGRAM

BACKGROUND

Network-based services systems have become widely available in recent years. Network-based services systems are typically geographically and logically separate from the client subscribing to the network-based service. Network-based services may include one or more computers configured to be storage resources (e.g., virtual disk drives, cloud storage) and/or virtual compute resources (e.g., cloud computing), for example. The resources in various configurations may be used, for example, by businesses (e.g., on-line retail, web based hosting services, financial services) for backup data storage, records storage, to store product images, process customer requests, and/or other computing tasks. In network-based service systems, the performance of the one or more services in the system may be analyzed to determine client usage profiles, peak usage times or latency between various points of the system, for example. To analyze performance, monitors may be implemented at multiple points in the network-based service and the monitors may be configured to continuously monitor many performance metrics of the network-based system (e.g., CPU utilization, latency to respond to requests, available storage, usage profiles, etc.) The continuous stream of performance data may be further compiled to report the results of the monitoring.

As an example, a network-based services system may be configured as a storage service to provide storage for backup data or web hosting services. One or more clients of the network-based service may store (put) and retrieve (get) data from a network-based storage service. A localized resource (e.g., host computer) of the network-based service may monitor the latency for the puts and gets over time. The performance data generated by the monitoring may be used to analyze network and/or service performance. In addition, the monitored data may be stored for further analysis and/or post-processed to further examine the monitored data.

However, as the number of clients, the amount of performance data, and/or the number of performance metrics monitored grows, significant resources may be required to store the monitored data and the post-processed data (e.g., reports), and/or significant compute resources may be required (e.g., CPU) to process the monitored data. As a result, administrators of network-based services may implement data sampling to reduce the amount of monitored data stored. This may result in inaccuracies in system performance data and affect planning and/or responsiveness to system problems.

Figure 1:
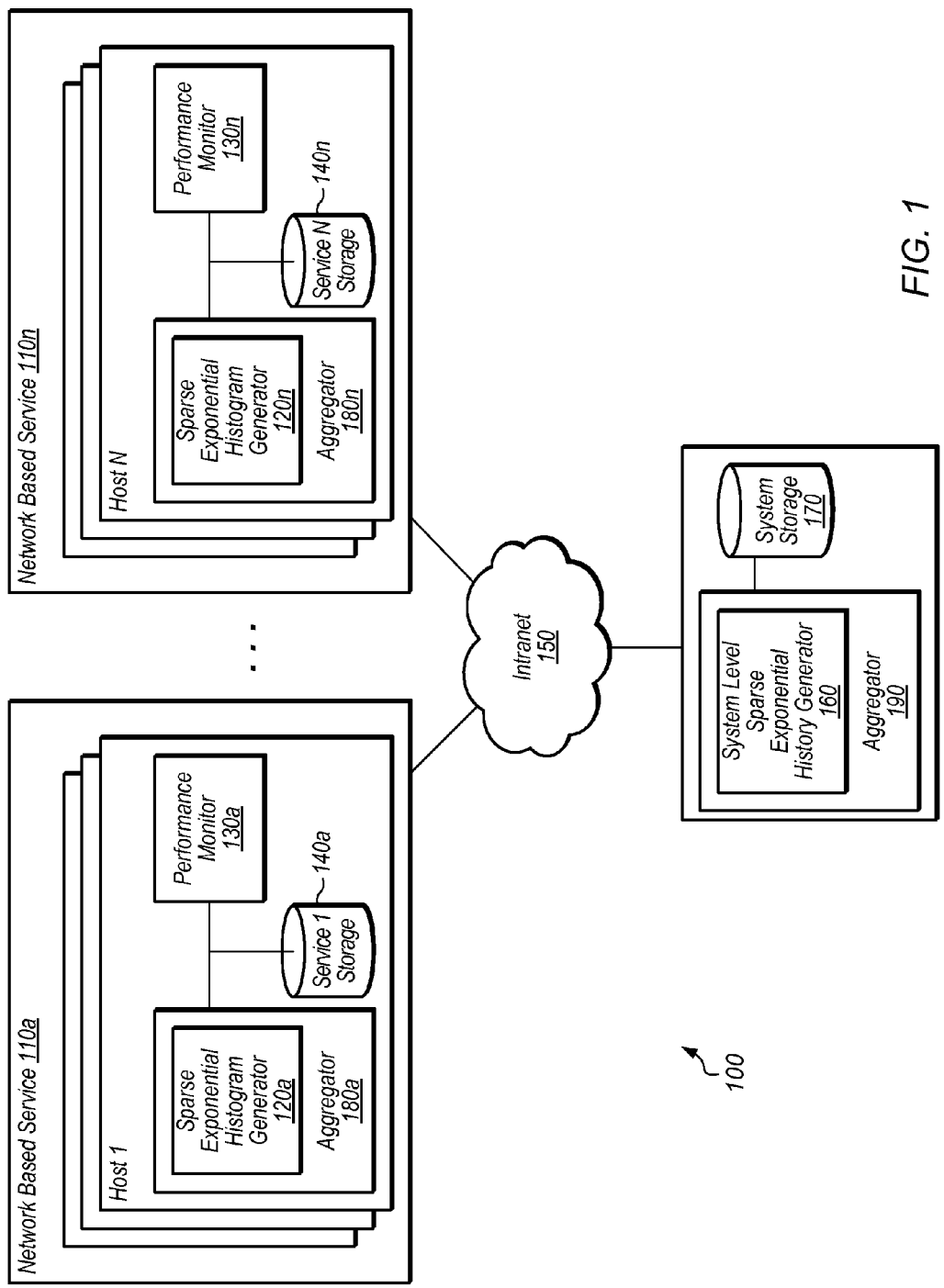
FIG. 1 illustrates a block diagram of a network-based services system that supports efficient data aggregation with sparse exponential histograms, according to one embodiment.

While the technology described herein is susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the present disclosure as defined by the appended claims.

DETAILED DESCRIPTION OF EMBODIMENTS

Systems and methods are described herein for providing efficient aggregation of performance data with sparse exponential histograms. In general, an exponential histogram is a representation of a data distribution according to frequency counts for buckets of data value ranges on a logarithmic scale. For example, the distribution of data may be plotted on the x-axis in buckets and on a logarithmic scale. The y-axis may represent the frequency count of the data in the data distribution. An exponential histogram representation is made sparse by omitting representation of buckets that have a zero frequency count.

For example, a system for providing efficient performance data aggregation with sparse exponential histograms may comprise one or more computers configured to provide one or more network-based services (e.g., storage, virtual compute) to one or more clients. To monitor one or more performance metrics of the network-based service system, one or more performance monitors may be implemented. The performance monitors may be configured to monitor one or more performance metrics at a single host level and/or across one or more hosts internal to the network-based service. The performance monitors may be configured to transmit and/or record (e.g., logs, records, etc.) the performance data continuously or at given time intervals. In addition, there may be one or more aggregators configured to manage the performance data. An aggregator may be implemented at the host level, in each network-based service, or for the system as a whole. The aggregator may comprise a sparse exponential histogram generator configured to parse the performance data into a dimension/metric/time interval of interest. A sparse exponential histogram representation may be generated with the parsed data. In addition, the aggregator may be configured to aggregate the sparse exponential histograms for a given dimension/metric/time interval into a composite of sparse exponential histograms. For example, a histogram for a given dimension/metric/time interval may be combined into a composite the same dimension/metric over multiple time intervals. As another example, a histogram of a single host/latency for a given time interval may be aggregated into a multiple host/latency for a given time interval.

In addition, a network-based services system may implement a system level aggregator comprising a sparse exponential histogram generator. The aggregator at the system level may be configured to receive data from internal clients (e.g., the network-base services) and/or external clients (e.g., subscribers to the network-based service) and generate reports and/or histograms based on a schema. The schema may be used to define the dimension (e.g., single host, CPU, data center, service), the metric (e.g., latency, system utilization), and/or time interval (e.g., 1 minute, 1 second, etc.) of interest for the report and/or sparse exponential histogram. A system level sparse histogram generator in the aggregator may parse client (e.g., internal, external) data and generate sparse exponential histograms representations of the data.

For example, in some embodiments, a network-based service may be configured to implement a storage service. Each client of the network-based service may be configured to share resources although they do not logically interact, for example. The administrator of the service may be interested in the length of time between (e.g., latency) each external client's request for data and sending the data. The performance monitor may record the performance data metric (e.g., latency) for each request for data at given time intervals. The sparse exponential histogram generator may generate a sparse exponential histogram representation for the network-based service for the latency at given time intervals (e.g. 1 minute, 1 hour, etc.). In addition, an aggregator in the network-based service system may receive the sparse exponential histograms for each time interval and further combine them into composite sparse exponential histograms of interest. In addition, the performance data and/or sparse exponential histograms may be transmitted to storage for later analysis and/or aggregation based on a schema of interest.

FIG. 1 illustrates a block diagram of a network-based services system that supports efficient performance data aggregation with sparse exponential histograms, according to one embodiment. In general, a network-based service system 100 may provide one or more network-based services 110 (e.g., storage, virtual compute) to external clients (not explicitly shown). Network-based service system 100 may be implemented on one or more computers and may be implemented as a distributed network. In some embodiments, network-based services may be implemented by computers is geographically disperse data centers. Administrators of the network-based services may implement one or more performance monitors to monitor one or more performance metrics of the network-based service(s). Performance monitor 130 may monitor, for example, performance metrics (e.g., latency, CPU utilization) at a single host and/or a multiple hosts. A performance monitor may be configured to record the performance data in logs and/or store the performance data. Aggregator 180 may be implemented to parse performance data received from the performance monitor and/or aggregated data from sparse exponential histogram generator 120. Sparse exponential histogram generator 120 may be implemented to use the performance data to generate sparse exponential histograms. Sparse exponential histogram generator 120 may create histograms for a given metric/dimension pair. An example of a monitored metric, as described above, may be latency. The dimension may represent a level and/or grouping for the metrics. For example, a dimension may be a single host in the network-based service, a CPU, a data center and/or a network-based service. The sparse exponential histogram representation may represent a range of values for a metric that may be divided into buckets. The range of values from the performance data and total number of buckets defines the granularity or range of each bucket (e.g., x-axis of histogram). The data value range for each bucket increases exponentially. The exponential aspect of the histogram compresses the performance data and contributes to an increase in computational speed. The histogram representation includes a frequency count (e.g., y-axis of histogram representation) for each bucket reflecting the number of occurrences of values within the performance data from the performance monitor that fall within the range for the respective bucket. In some embodiments, the frequency count for each bucket in the histogram representation may be based on a sample or weighted sample of the performance data. In some embodiments, the frequency count may be a floating point or other non-integer value. Buckets that have a zero frequency count may not be represented in the sparse exponential histogram. This may minimize storage 140 required for the histograms since buckets that have zero entries may not have a data structure element in storage assigned to them. The histogram will be described in further detail below.

In addition, an aggregator 190 comprising a system level sparse exponential histogram generator 160 may be implemented. Aggregator 190 may be configured to aggregate performance data from internal and/or external clients and generate reports and/or histograms according to a schema. As described above, a schema may be a metric, dimension and/or time interval of interest. The system level sparse exponential histogram generator 160 may be configured to create a sparse exponential histogram or combine the histograms according to a schema (e.g., latency of all network-based services in a system). FIG. 1 illustrates a system for supporting sparse exponential histograms.

System 100 comprises one or more network-based services 110 configured to offer one or more service to clients (not explicitly shown). Network-based services 110 may be configured to provide network-based compute services, or storage services to provide data backup services to clients, for example. To monitor performance metrics, service-level or host-level performance monitor 130 may be implemented. Examples of performance metrics that may be monitored are latency, CPU utilization and/or storage utilization. Performance monitor 130 may be configured to monitor any number of performance metrics within the network-based service. The performance metrics may be monitored in one or more dimensions. Examples of dimensions are performance for a single processor, single host, multiple hosts, service type, etc. Performance monitor 130 may be configured to gather the one or more metrics for one or more dimensions continuously or at a given time interval (e.g., 1 minute, 5 minutes etc.). The performance data may be recorded and/or stored (e.g., logs, records, etc.) in storage 140 and subsequently transmitted to or accessed by aggregator(s) 180 or 190.

Aggregator 180 may be configured to aggregate performance data generated by a host-level or service-level performance monitor 130 and generate sparse exponential histograms of the performance data according to a schema. As described above, a schema may be defined (e.g., by a system administrator) to specify a metric, dimension and/or time interval of interest for which aggregator 180 generates sparse exponential histograms of performance data accessed from performance monitor 130 or storage 140. Aggregator 180 may parse the data into a dimension/metric pair for a given time interval according to the schema and create a histogram using sparse exponential histogram generator 120.

Sparse exponential histogram generator 120 may be configured to generate a sparse exponential histogram from the performance data captured by performance monitor 130. Sparse histogram generator 120 may generate a sparse exponential histogram of the performance data for a dimension and metric of interest. A dimension may be a given configuration and/or level within the network-based service. A dimension may be a single host (e.g. one or more computers), multiple host and/or all hosts within a network-based service, for example. As another example, a dimension may be a single processor, virtual machine or process in a single host. The metrics may be, for example, latency, CPU utilization and/or storage utilization as described above. Sparse exponential histogram generator 120 may be configured to determine the size of buckets for the histogram, e.g., based on the range of values for the performance metric under evaluation. The number of buckets for the sparse exponential histogram is not fixed, in some embodiments. In alternate embodiments, sparse exponential histogram generator 120 may determine the number of buckets in addition to the size of the buckets. Examples of determining the number of buckets and the width of the buckets are discussed below. The buckets may be represented on the x-axis on a logarithmic scale depending on the performance metric under evaluation. In other words, the data value range for each bucket may increase according to an exponential term from one bucket to the next. Sparse histogram generator 120 may be configured to populate the histogram with the parsed performance data. The y-axis of the sparse exponential histogram may represent the frequency count for each bucket of the parsed performance data values that fall within the respective range assign to each bucket. The populated histogram may be transmitted and/or stored in service storage 140 and/or aggregator 180. To save storage space and compute time, buckets of the exponential histogram with zero entries may not be stored or transmitted, resulting in a sparse exponential histogram representation of the parsed performance data. The details of generating the sparse exponential histograms will be discussed in later figures.

Service storage 140 may include, but is not limited to disk drives, solid state storage devices, and/or other magnetic or optical storage. Examples of disk drives are optical drives and magnetic recording disk drives. Service storage 140 may be configured as a single disk drive and/or multiple disk drives (e.g., RAID).

In addition, system 100 may also include a system level sparse histogram generator 160, aggregator 190 and system storage 170. These components are similar to the ones described above (e.g., sparse exponential histogram generator 120, aggregator 180 and/or storage 140) but may be implemented to perform generating histograms, aggregating data and/or histograms and/or storing the performance data and/or histograms for all of the network-based services within the system. System level aggregator may provide a performance data aggregation and reporting service for the various network-based services 110. As such, network-based services 110 may be clients of aggregator 190. Aggregator 190 may gather performance data and/or sparse exponential histograms from each network-based service 110. In some embodiments, aggregation and sparse exponential histogram generation of performance data may be performed on the client side (e.g., at network-based service 110). Thus, instead of requiring larger amounts of raw performance data to be transmitted from network-based services 110 to aggregator 190, more compact sparse exponential histogram representations of the performance data for each service may be transmitted to aggregator 190. Aggregator 190 may generate reports from the received and/or stored sparse exponential histogram representations and/or perform additional aggregations (e.g., at larger time or system dimensions) and generate new sparse exponential histogram representations accordingly. In some embodiments, aggregator 190 may aggregate stored sparse exponential histograms to create aggregated sparse exponential histograms based on a schema or as requested by user input. For example, sparse exponential histograms representations for latency of a network-based service at different data centers may be stored separately for each data center, and the stored sparse exponential histogram representations may later be aggregated from stored representations to create a global latency sparse exponential histogram representation for the network-based service for all data centers.

In addition, aggregator 190 may be configured to receive performance data from clients external to network-based services system 100. The external client data may comprise metrics values for various dimensions and/or time intervals similar to the performance data discussed above. Aggregator 190 may be configured to generate reports and/or sparse exponential histograms for internal and/or external clients according to a schema. The schema may be provided by the client, in some embodiments.

System level sparse exponential histogram generator 160 may be configured to generate sparse exponential histograms from performance data for the network-based services and/or performance data received from external clients. System level sparse exponential histogram generator 160 may parse the performance data into a dimension/metric pair for a given time interval as described above. System level sparse exponential histogram generator 160 may generate the sparse exponential histogram in a manner similar to that described above for sparse exponential histogram generator 120.

System storage 170 may include, but is not limited to tape drives and/or one or more disk drives. Examples of disk drives are optical drives and magnetic recording disk drives. System storage 170 may be configured as a single disk drive and/or multiple disk drives (e.g., RAID). System storage 170 may store performance data and/or sparse exponential histograms from internal and/or external client for subsequent analysis.

For example, a network-based service may have multiple clients. The administrator of the network-base service may want to forecast the need for new hardware and/or software needed to ensure that the multiple clients experience quality service with no down time while allowing for room for expansion for new clients. To assess this, the administrator may track a metric such as latency of the network-based service. The administrator may configure performance monitor 130 to monitor the latency for requests handled at each host in the network-based service along with other performance metrics within the network-based service. Performance monitor 130 may continuously provide the performance data for the sparse exponential histogram generator 120. Sparse histogram generator 120 may parse the latency data from other performance monitor data and create the sparse exponential histogram representation of latency for requests handled at the given host during a given time interval. For example, sparse histogram exponential generator 120 may populate a sparse exponential histogram with the 1-minute latency determined from the parsed performance data for a 1-minute time interval. Aggregator 180 may further combine the data into a composite histogram of 5-minute interval for a single host to show the latency over a longer time period. In addition, aggregator 180 or 190 may combine the data to show the latency for all hosts of a given service during the 1 and 5-minute time intervals. The composite sparse exponential histograms generated by aggregator 180 may be transmitted and/or stored in system storage 170 and/or system level sparse histogram generator 160 for further analysis and/or post-processing. For example, an administrator may want to evaluate the latency across multiple sites (e.g., geographic locations) for a given time period. The aggregator may retrieve data for the multiple sites from system storage 170 to create a new composite histogram reflecting the latency for multiple sites for a given time period.

Figure 2:
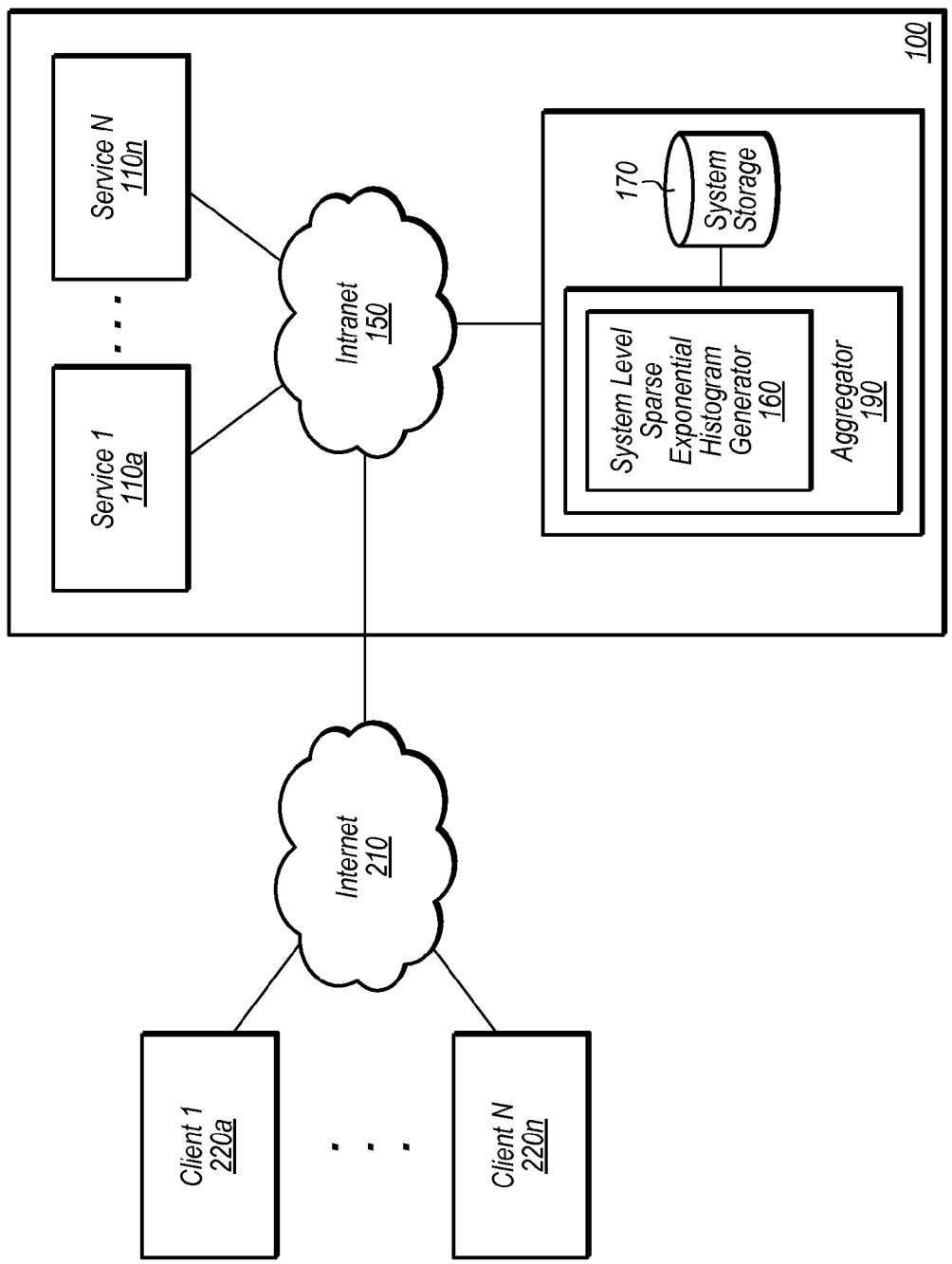
FIG. 2 illustrates a block diagram of a network-based services system that supports efficient data aggregation with sparse exponential histograms for external clients, according to one embodiment.

FIG. 2 illustrates a block diagram of a network-based services system that supports efficient data aggregation with sparse exponential histograms for external clients, according to one embodiment. System 100 in FIG. 2 may be an example of the configuration depicted in FIG. 1. Similar numbers are used to represent similar components. In general, as described above, network based service 110 may provide a service to one or more clients 220. Client 220 may access the network-based service system via the Internet and may utilize one or more network-based services 110. The network-based service may also provide an aggregator and/or sparse exponential histogram generator services for external client 220 in a similar manner as provided for internal clients (e.g. services 110). In other embodiments, the service could be provided to external clients as a separate, stand alone service. The service may return the generated sparse exponential histogram representations to the client, or store them for later retrieval. For example, sparse exponential histograms generated for external clients may be stored in storage 170 and/or a storage service provided by one of services 110. The data may be performance data, or other types of data. The service may provide an interface to allow the client to specify a schema defining how data should be aggregated. The service may also provide analysis services of the data based on the sparse exponential histogram representations.

Figure 3:
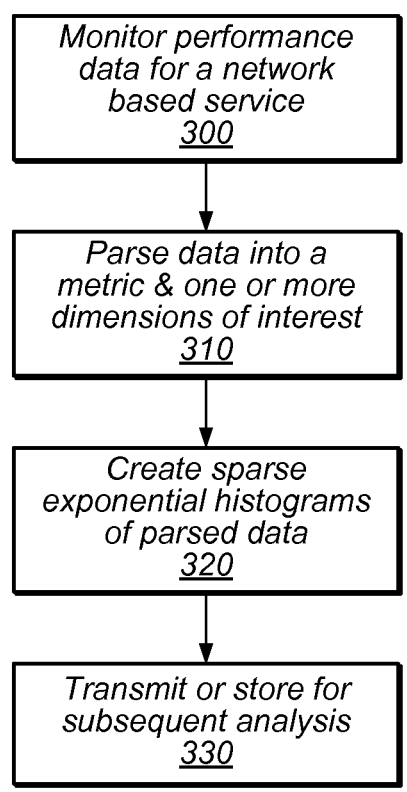
FIG. 3 is a flow diagram illustrating a method for generating a sparse exponential histogram, according to one embodiment.

FIG. 3 is a flow diagram illustrating a method for generating a sparse exponential histogram of performance data for a network-based service, according to one embodiment. In general, a network-based services system (e.g., system 100 in FIG. 1) may monitor one or more performance metrics in a performance monitor (e.g., performance monitor 130 in FIG. 1). The performance data may be recorded and/or stored (e.g., logs, records etc) and used by a sparse exponential histogram generator (e.g., sparse exponential histogram generator 120 in FIG. 1) to generate a sparse exponential histogram representation for a given metric for a given time interval and/or dimension. As discussed above, examples of dimensions are single host or service level. Examples of metrics are CPU utilization or latency. The performance data may be parsed into a dimension/metric pair of interest by aggregator 180. The parsed performance data may be used to generate a sparse exponential histogram. The parsed data and/or the sparse exponential histogram representation may be transmitted and/or stored for subsequent analysis. Details for generating a sparse exponential histogram are described below.

As indicated in 300, performance metrics for a network-based service may be monitored by the network-based service (e.g., service level performance monitor 130 in FIG. 1). One or more performance metrics to be monitored may be defined, for example, by an administrator of the network-based service and/or clients of the network-based service. The performance metrics may be monitored at a given time interval (e.g., 1 minute, 5 minute, hourly, daily) or on a continuous basis. The performance data at the given time interval may be transmitted to a sparse exponential histogram generator (e.g., performance sparse histogram generator 120 in FIG. 1) for processing.

As indicated in 310, the performance data at the given time interval may be parsed into one or more dimensions and/or metrics of interest for a given time interval (e.g., in performance sparse histogram generator 120 in FIG. 1). As discussed above, a dimension may range from a single host within network to all of the hosts within a network-based service. As discussed above, a metric may be latency, CPU utilization and/or storage utilization, for example.

As indicated in 320, the parsed performance data may be used to populate a sparse exponential histogram representation. As discussed above, an exponential histogram is a graphical representation of a distribution of data. Each bucket represents a range of values, where the range increases exponentially from bucket to bucket. A frequency count of values from the parsed performance data falling within the range of each bucket is stored for each bucket. Information for buckets with zero frequency count may not be stored in some embodiments, making the representation "sparse."

As indicated in 320, the parsed data may be used to determine the frequency count represented in the histogram for each bucket. For example, if bucket 2 is defined to represent data ranging from 1E+6 to 1.3E+6 and 300 values in the parsed data fell into that range, the frequency count for that bucket would be 300. A bucket frequency count may be determined for all the parsed values. As discussed above, although the examples show frequency count as an integer number, in some embodiments, the bucket may represent non-integers such as floating point or weighted values. The frequency count of each bucket may correspond to the y-axis on a plot of the histogram. If a bucket has zero entries, it is not transmitted or stored as part of the sparse exponential histogram representation. The sparse exponential histogram may be compressed to remove the zero entry buckets. This means that no data structures are reserved to represent the bucket with zero frequency count entries (e.g., sparse). This may save storage space and/or compute resources when transmitting, storing and/or further analyzing the data.

As indicated in 330, the performance data and/or sparse exponential histograms may be transmitted and/or stored for subsequent analysis. The data may be transmitted to local storage within the network-based service and/or stored in system storage. The stored data (e.g., performance data and/or sparse exponential histogram data) may be analyzed at a later date or aggregated into a composite histogram according to a schema. An example of a sparse exponential histogram created with the method described above is provided in FIG. 4.

Figure 4:
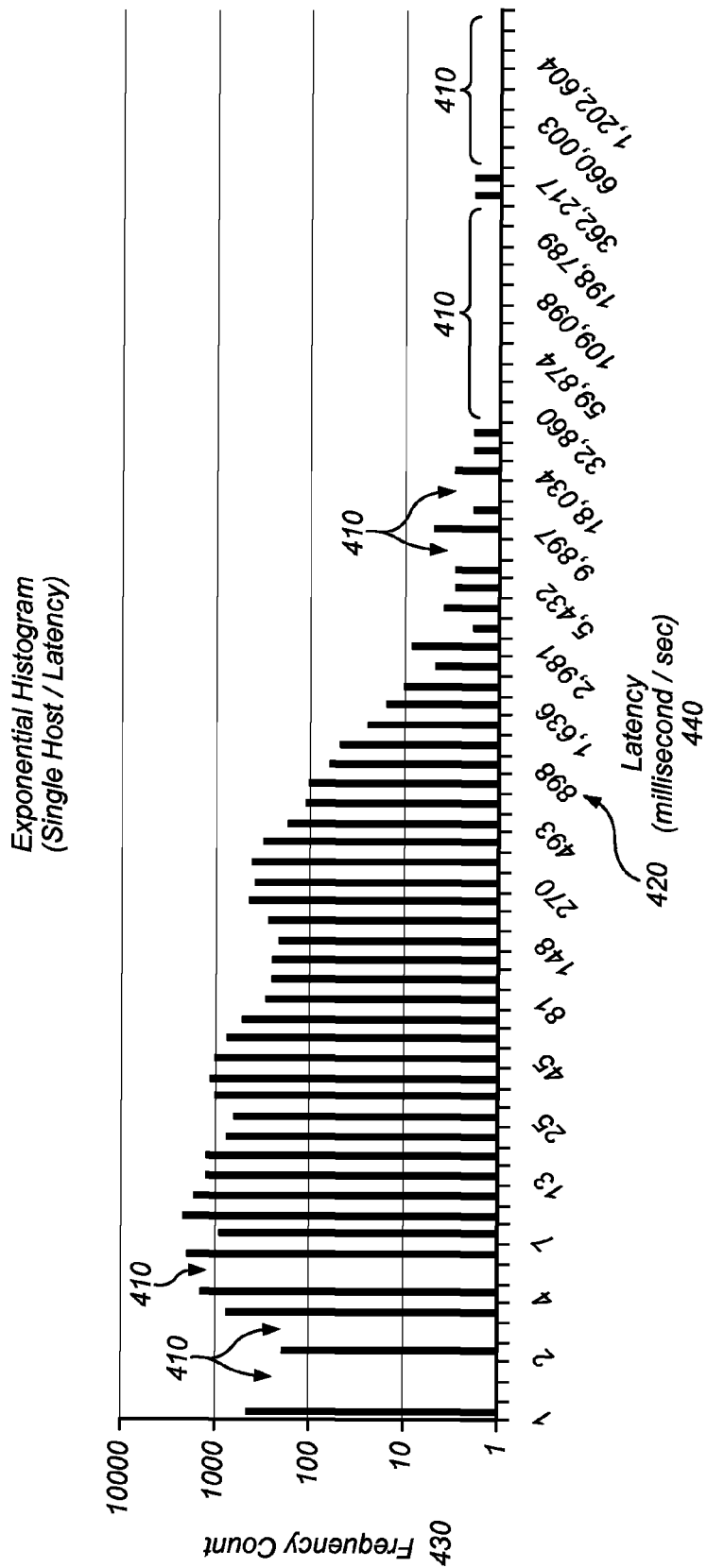
FIG. 4 illustrates an example of a sparse exponential histogram of the latency of a single host, according to one embodiment.

FIG. 4 illustrates an example of a plot of a sparse exponential histogram representation of the latency of a single host, according to one embodiment. In general, as described above in FIGS. 1-3, a sparse exponential histogram representation may represent a dimension/metric pair for a given time interval. As in this example, a dimension/metric pair is a single host/latency representation for a given time interval. The x-axis represents the bucket (e.g., range of values) on a logarithmic scale where each bucket range exponentially increases in size. The y-axis represents the frequency count for each value in each respective bucket, also on a logarithmic scale in this example.

Frequency count 430 may be represented on the y-axis. The frequency count represents that number of occurrences of latency values for each respective bucket value range. As depicted, one can see the scale on the y-axis for the frequency count increases by orders of magnitude. Latency 440 may be measured in milliseconds and may be represented on the x-axis on a logarithmic scale. Generating the graph with these representations may create a more concise plot when a wide range of values is expected, such as for data distributions have long tails.

In the graph depicted at 420, the bucket having an upper-end value of 898 milliseconds has 100 entries. In the bucket in 420, the 100 entries may not all be exactly 898 milliseconds. As discussed in FIG. 3, each bucket may have a width to allow for a range of values within each respective bucket. For example, the bucket at 420 may include values ranging between the maximum+1 of the adjacent bucket to the maximum of the current bucket (e.g., 898 milliseconds).

As indicated at 410, there are several buckets with zero entries. This indicates that those values were not measured during monitoring (e.g. performance monitor 130 in FIG. 1) and in the performance data received by the sparse histogram generator (e.g., performance sparse histogram generator 120 in FIG. 1). When the sparse exponential histogram representation is transmitted and/or stored, the sparse buckets will not be represented in the data structure, thus saving storage and compute resources.

Figure 5:
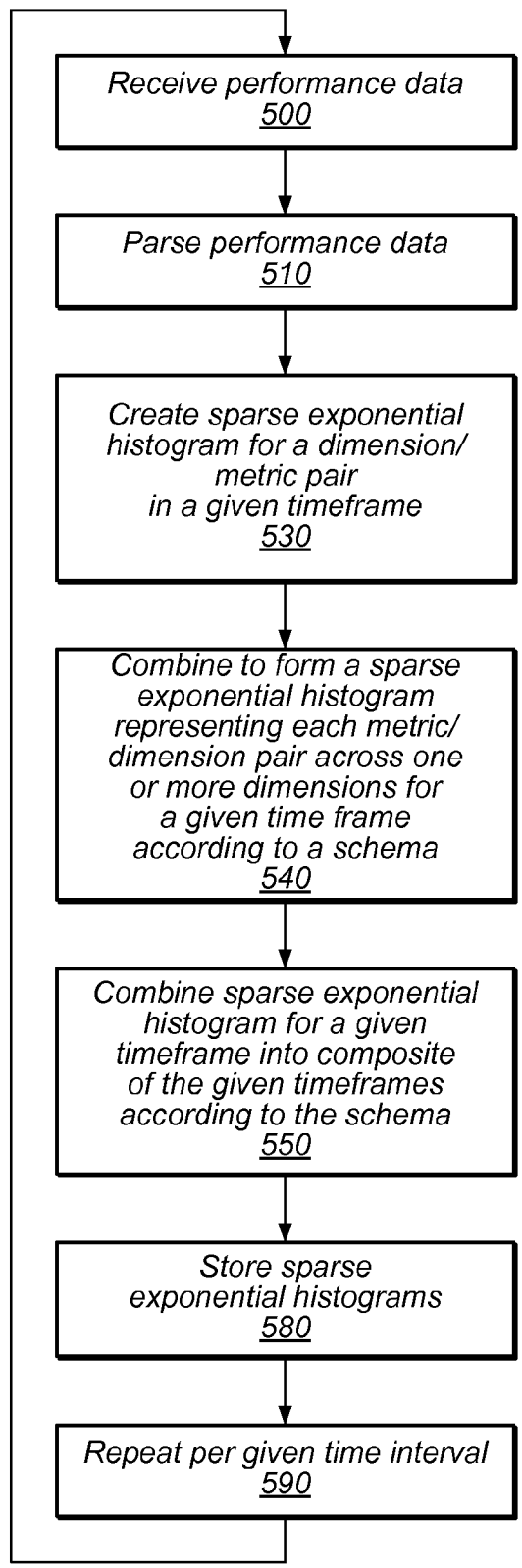
FIG. 5 is a flow diagram illustrating a method for generating a sparse exponential histogram for a given timeframe and composite histograms for multiple timeframes, according to one embodiment.

FIG. 5 is a flow diagram illustrating a method for generating a sparse exponential histogram for a given timeframe and composite histograms for multiple timeframes, according to one embodiment. As discussed above, a network-based service may implement a performance monitor (e.g., performance monitor 130 in FIG. 1) and a histogram generator (e.g., performance sparse exponential histogram generator 120 in FIG. 1) to monitor and analyze performance metrics of a network-based service and/or host for a given time interval. At the network-based service level, for example, the data may be gathered at given time intervals. At the system level, an aggregator (e.g., aggregator 190 in FIG. 1) and histogram generator (e.g., system level sparse exponential histogram generator 160 in FIG. 1) may be implemented to generate a histogram representing each metric/dimension pair across one or more dimensions according to a schema for a given timeframe. At either level, the sparse exponential histograms and/or the performance data may be stored (e.g., service storage 140 and/or system storage 170 in FIG. 1) for subsequent analysis. The method to create composite sparse exponential histograms may occur as described below.

As indicated in 500, performance data may be received. Performance data may include the data for one or more performance metrics (e.g., latency, CPU utilization, etc.) for one or more dimensions for a given time interval (e.g., 1 minute, 1 hour, etc.). Performance data may be monitored and/or recorded (e.g., logs, records) by an aggregator and/or service level performance monitor as described in FIG. 1.

As indicated in 510, the received performance data may be parsed into a dimension/metric pair of interest. To continue the example of FIG. 4, the dimension metric pair may be single host/latency for the given time interval. The parsed data may then be used to create a sparse exponential histogram as depicted in 530.

The sparse exponential histogram representation created in 530 may be created as described in FIG. 3. For example, for a given number of performance metric values, a predetermined bucket count and/or a known range of values (e.g., the units of the performance metric values), a sparse exponential histogram representation may be created. The y-axis may depict the frequency count for a respective range of values for each respective bucket. The x-axis may depict each bucket where each bucket represents a range of values corresponding to the performance metric under evaluation. The bucket width may exponentially increase for each respective bucket. The bucket width may be determined dependent on the number of buckets and the total range of values for the performance metric of interest. In some embodiments, a bucket may have a zero frequency count. In some embodiments, when the sparse exponential histogram is transmitted and/or stored, empty buckets will not be stored and/or represented in the histogram representation data structure to reduce storage and computational requirements. As described in FIG. 1, the sparse exponential histogram representation may be generated by a sparse exponential histogram generator 120.

Sparse exponential histogram representations for a given dimension/metric pair for a given time interval may be generated on the client side, e.g., at the given host or service, or the raw performance data may be sent to or accessed by a service to create the sparse exponential histogram (aggregator 190 in FIG. 1 may be such a service). Histogram representations for each network-based service or host may be aggregated across one or more other dimensions according to a schema for a given time frame as indicated in 540. This may be performed by an aggregator at the system level (e.g., aggregator 190 in FIG. 1), for example.

As indicated in 550, the sparse exponential histogram representation aggregated in 540 according to a certain schema, may be further aggregated or combined into a sparse exponential histogram representation for a time frame that is a multiple for the base time frame used in 520. For example, 5 sparse exponential histogram representations for a 1-minute interval for a given schema may be combined into a 5-minute interval sparse exponential histogram representation. As each 1-minute sparse exponential histogram representation is created, a new 5-minute sparse histogram representation may be created for the last five 1-minute time intervals (e.g., by adding the last five 1-minute sparse exponential histograms together).

As indicated in step 560, all histogram representations may be stored (e.g., system storage 170) for subsequent analysis. To continue the example provided in FIGS. 3 and 4, the single-host/latency dimension pair for a base time interval may be represented in a sparse exponential histogram. For the same time frame, all of single host latency for a given network-based service may be transmitted and/or retrieved from storage (e.g., system storage 170). The data may be combined according to a schema (e.g., all single hosts in the network-based service). This data may be aggregated into a new composite sparse exponential histogram representation for the entire network based service, according to the schema.

Figure 6:
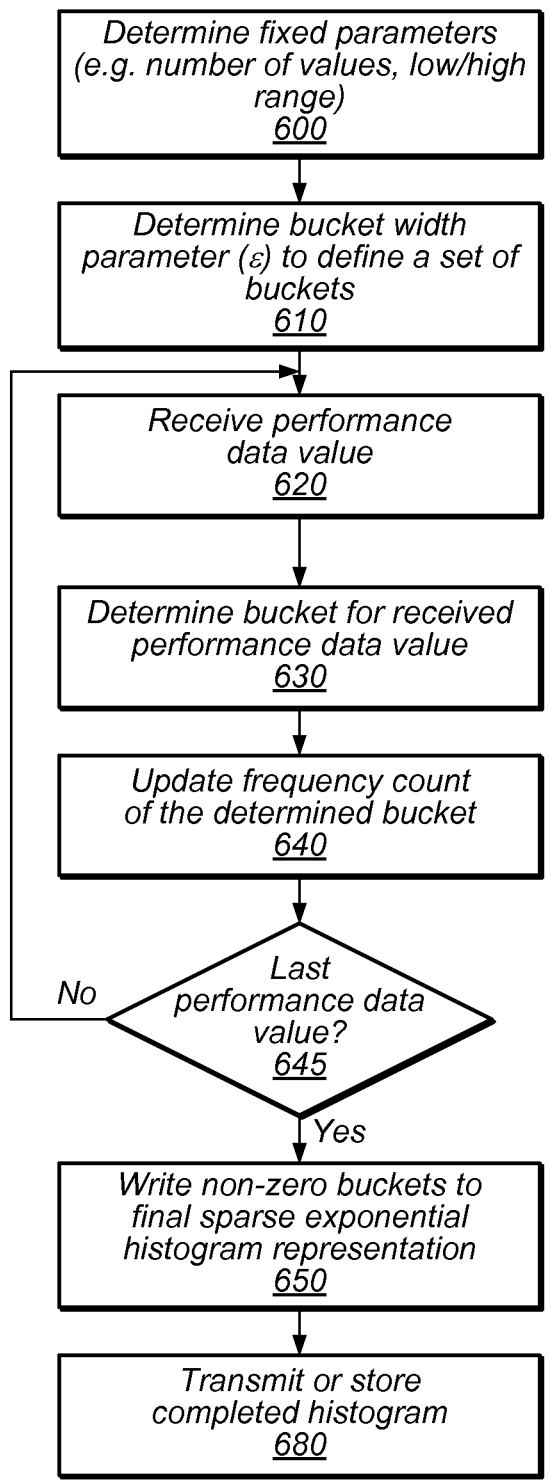
FIG. 6 is a flow diagram illustrating a method for creating sparse exponential histograms, according to one embodiment.

FIG. 6 is a flow diagram illustrating a method for creating sparse exponential histograms, according to one embodiment. In general, as described in the above figures, once the performance data is received the data may need to be parsed since performance data may be monitored for more than one dimension and more than one metric. From the parsed performance data, fixed parameters such as the number of values and the range of values may be determined for a given dimension/metric pair. For a given dimension/metric pair, the fixed parameters may be used to determine the bucket width for the data to be evaluated. Once the buckets have been defined, each of the performance data values may be examined to determine the frequency count for each bucket. When the bucket for a given performance data value is determined, the count for that bucket is incremented. After all of the performance values have their buckets determined, the non-zero values of the histogram may be transmitted and/or stored. Only transmitting/storing the non-zero values creates a sparse histogram, since buckets with zero content do not consume storage and/or compute resources.

As indicated in 600, the fixed parameters for the sparse exponential histogram may be determined. The fixed parameters may be the number of values (e.g., performance data for a given metric) and the low/high range of values (e.g. 1-1,000,000). The number of buckets for the sparse exponential histogram may be unspecified. In alternate embodiments, the number of buckets (e.g., 4096) may also be determined. These values may determine the bucket width according to the following formula.

As indicated in 610, the parameter $\epsilon$ (e.g., bin width or error parameter) may be determined based on the amount of error (e.g., 0.2) acceptable for given performance data. In an alternate embodiment, with a fixed number of bins (e.g. B) the parameter $\epsilon$ may be determined by the following equation:

$$\epsilon = 1/B(\log U),$$

where B is the number of buckets (e.g., 4096) and U is the top value in the range (e.g., 1,000,000) for the performance data under consideration.

Once $\epsilon$ is known (e.g. chosen as an error parameter and/or in alternate embodiments calculated for a fixed number of buckets), the bucket sizes may be determined by the following scheme:

Bucket 1=[1,(1+$\epsilon$)], Bucket 2=[(1+$\epsilon$),(1+$\epsilon$)$^2$], Bucket 3=[(1+$\epsilon$)$^2$,(1+$\epsilon$)$^3$] etc.

If the parameter $\epsilon$ is pre-determined based on the amount of allowable error, then the number of buckets may vary. In alternate embodiments, where the number of buckets (e.g., B) is fixed, the last bucket width may be determined by $$[(1+\epsilon)^{B-1},(1+\epsilon)^B],$$

where B is the number of buckets. In some embodiments, the buckets of a sparse exponential histogram may be plotted on the x-axis of the histogram using a logarithmic scale.

As indicated in 620, each performance data value is evaluated. The data is evaluated to determine a bucket as indicated in 630. The bucket for each value may be determined by the following equation:

$$K = \log(v)/(\log(1+\epsilon)),$$

where $\epsilon$ is an error parameter. In alternate embodiments, where the number of buckets is fixed, the bucket for each value may be determined by the following equation:

$$K = \log(v)*(B/\log(U)),$$

where v is the performance data under evaluation, B is the number of buckets and U is the high value in the range of data. For the received value, the frequency count for the determined bucket is updated, as indicated at 640. As discussed above, frequency count may be an integer value and/or a non-integer value. This process is repeated for each performance data value until the last performance data value has been processed, as indicated at 645. Once all of the performance data has been evaluated, the final non-zero frequency counts are stored for the final sparse exponential histogram representation of the performance data, as indicated at 650. The computed sparse exponential histogram representation may be transmitted and/or stored as indicated in 680.

Figure 7:
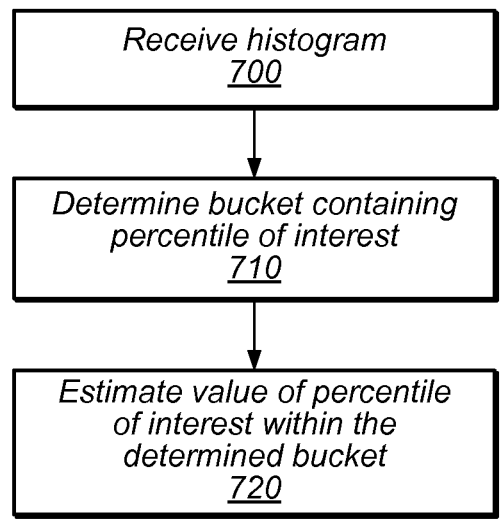
FIG. 7 is a flow diagram illustrating an example method for data analysis using sparse exponential histograms, according to one embodiment.

FIG. 7 is a flow diagram illustrating an example method for data analysis using sparse exponential histograms, according to one embodiment. In general, sparse exponential histograms may provide the frequency count for a given performance metric during a given time interval. In some embodiments, the histograms may be further evaluated to focus on the result of a specific data point. Each sparse exponential histogram may have a distribution of data (e.g., uniform, bell curve, etc.). Given a distribution, a characteristic such as the 99$^{th}$ percentile may be determined. For example, the previous FIGs. described a sparse exponential histogram representation for latency. An administrator may be interested in determining the latency experienced by a given percentage of users of the network-based service. An administrator may wish to determine, for example, the 99$^{th}$ percentile latency that internal and/or external clients are experiencing for a given time period. An administrator may use this data to determine if corrective actions in the network-based system may be necessary.

As indicated in 700, a sparse exponential histogram representation may be received. As described above, a sparse exponential histogram representation may represent a dimension/metric pair of interest for a given time interval. The dimension/metric pair may be single host/latency, for example. The given time interval may be 1-minute and/or 5-minute, for example. As described above, the sparse exponential histogram representation may include buckets representing the range of values for the metric and/or time frame of interest. Each bucket may have a corresponding frequency count representing the number of times the values (e.g. latency) occurred within the range for that bucket during the given time interval. FIG. 4 is an example plot of a sparse exponential histogram.

As indicated in 710, once the sparse exponential histogram representation has been received, the bucket containing the percentile of interest may be determined. For example, the percentile of interest may be the 99$^{th}$ percentile. In a sparse exponential histogram representation with 100,000 values, the bucket with the 99$^{th}$ percentile value would be the bucket with the 99,000$^{th}$ highest value. Once the bucket is determined containing that value is determined (e.g., by summing frequency counts until the bucket is reached where the sum reaches or passes 99,000), an assumption may be used to estimate the value for the 99$^{th}$ percentile. As described above, each bucket in a sparse exponential histogram may include a range of values associated with each bucket. The range of values for the bucket may be determined by formulas discussed above. In some embodiments, the assumptions described below may be used to estimate a value for a given percentile.

For example, in some embodiments, if the distribution of the performance data for the sparse exponential histogram is unknown, the bucket containing the percentile of interest may be determined by counting the values in the histogram until the bucket with the percentile of interest is found. Once the bucket containing the value of interest is known, the actual value (e.g., latency at the $99^{th}$ percentile) may be estimated, as indicated in 720, according to the mid-point of the bucket range.

In alternate embodiments, the assumption about the distribution of the performance data represented in the sparse exponential histogram may be "slow varying". "Slow varying" assumes that the distribution is fairly uniform at the determined bucket. The percentile of interest may be estimated based on this uniformity. As discussed above, given a sparse exponential histogram with a uniform distribution of performance data with 100,000 entries, one may determine the $99^{th}$ percentile by determining which bucket has the $990,000^{th}$ entry. Once the bucket is determined, since the data within the bucket is assumed to be uniform, the value associated with the percentile of interest may be estimated, as indicated in 720, to be a given fraction of the bucket range. For example, if the determined bucket has a frequency count of 300 and the $990,000^{th}$ count was reached by adding 200 to the total count from all previous buckets, then the $99^{th}$ percentile value would be estimated at ⅔ of the value range for the determined bucket.

In a third embodiment, the assumption about the distribution of the performance data represented in the sparse exponential histogram may be "linear variation". In a "linear variation", the performance data may not be uniform. Once the bucket including the percentile of interest is determined the value of the percentile of interest may be estimated, as indicated in 720, according to the frequency count slope determined by one or more neighboring buckets.

Figure 8:
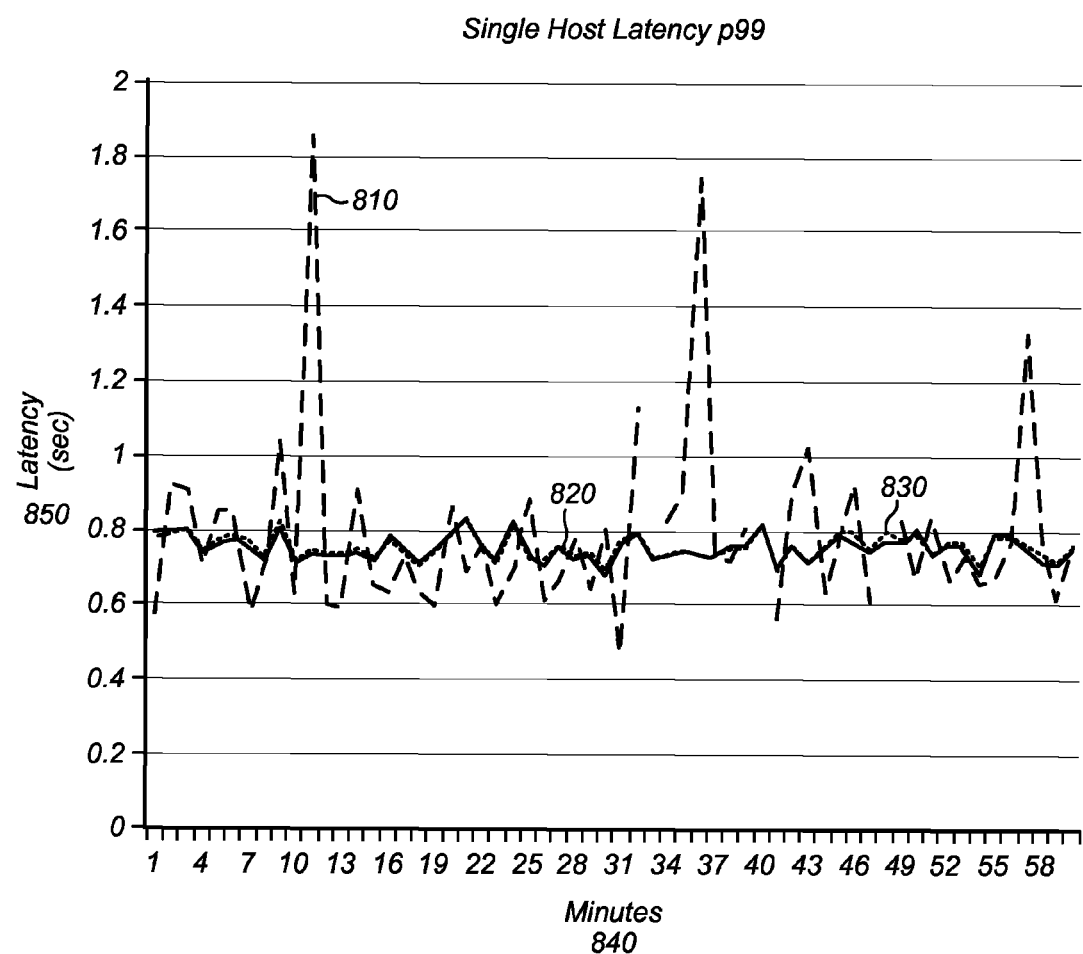
FIG. 8 illustrates experimental data comparing other methods to sparse exponential histogram for single host latency, according to one embodiment.

FIG. 8 illustrates experimental data comparing other methods to the sparse exponential histogram method for single host latency, according to one embodiment. One such other method is a sample plan for monitoring performance data. A sample plan may only record, for example, every $10^{th}$ latency value received in a performance monitor, or may record performance data at a sampling time interval, for example. Only examining a sample of the measured values may skew the results.

In the data for FIG. 8, two techniques were evaluated for a latency 850 (e.g., y-axis) over a 60-minute time period 840 (e.g., x-axis). The two techniques used to determine the $99^{th}$ percentile value for latency are from sampled data 830 and from a sparse exponential histogram created with an $\epsilon=0.2$ assuming uniform distribution 810. These values are compared against actual latency data 820. The sparse exponential histogram with uniform distribution 810 provides unexpected accuracy for determining the $99^{th}$ percentile latency 820 (actual and this data overlap in the diagram) as compared to the actual latency. In addition, the measurement accuracy is within expected fluctuations in the data. Lastly the sparse exponential histogram with uniform distribution 810 is more accurate than the method with the sampled data 830.

In addition to providing accurate results, the implementation of an aggregator and/or sparse exponential histogram generator on the client side, provided other unexpected results. For example, having the ability to aggregate the performance data and/or sparse exponential histograms, parse the performance data and/or generate a sparse exponential histogram on the client side results in approximately 60% decrease in data output from the network-based services to the system level aggregator, in one experiment. This represents a significant savings in network bandwidth usage and/or storage requirements.

To evaluate the impact of aggregation and/or sparse exponential histogram generation on the client side, experimental data was taken to examine CPU utilization and data volume when aggregating the performance data for a given network-based service. Although the aggregation has been moved to the client side, the method for generating sparse exponential histograms on the client side did not result in an added burden to the client (e.g. network-based service). Implementing the sparse exponential histogram method resulted in a decrease in CPU utilization and a decrease in data compared to other techniques. For example, in a network-based service configured as storage that implemented the sparse exponential histogram method decreased CPU utilization for data aggregation on the client side from 6.4% to 1.7%. The volume of data decreased from 61 Mb/hour to 1 Mb/hour. Aggregating the performance data on the client side results in computational savings at the system level which may allow for a reduction in the system level compute resources.

Figure 9:
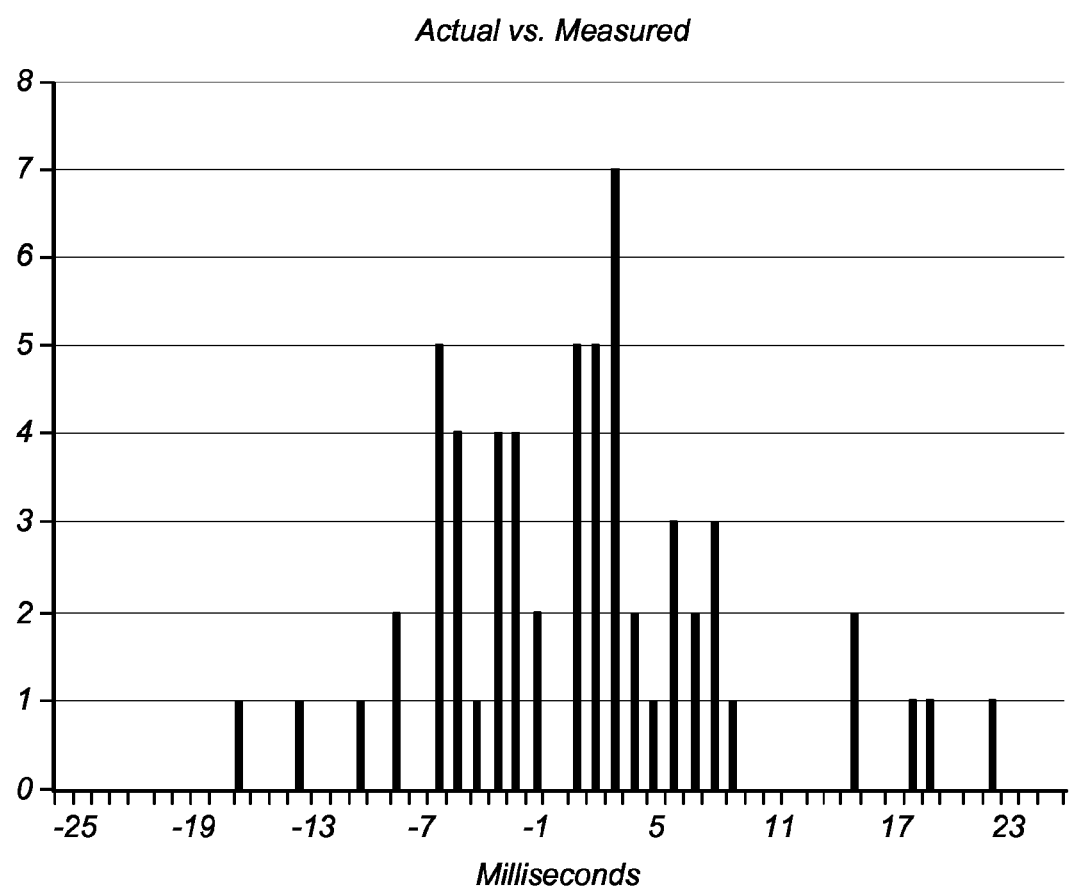
FIG. 9 illustrates a histogram plotting the difference between the actual latency data and the latency data determined by the $99^{th}$ percentile using a sparse exponential histogram method, according to one or more embodiments as described herein.

FIG. 9 illustrates a histogram plotting the difference between the actual latency data and the latency data determined by the $99^{th}$ percentile using a sparse exponential histogram method, according to one embodiment. As described in FIG. 8, the $99^{th}$ percentile of the sparse exponential histogram created with an $\epsilon=0.2$ with uniform distribution accurately matched the actual latency data. FIG. 9 shows the delta between each value in the graph shown in FIG. 8. It should be noted that the difference is a normal distribution, the mean is near zero and the distribution is narrow. This indicates accuracy in the results. For example, the root mean square deviation corresponding to this distribution is less than 8 milliseconds. This corresponds to a relative measurement accuracy of better than within 1% which is significant given the error parameter of 20% (e.g., $\epsilon=0.2$).

Figure 10:
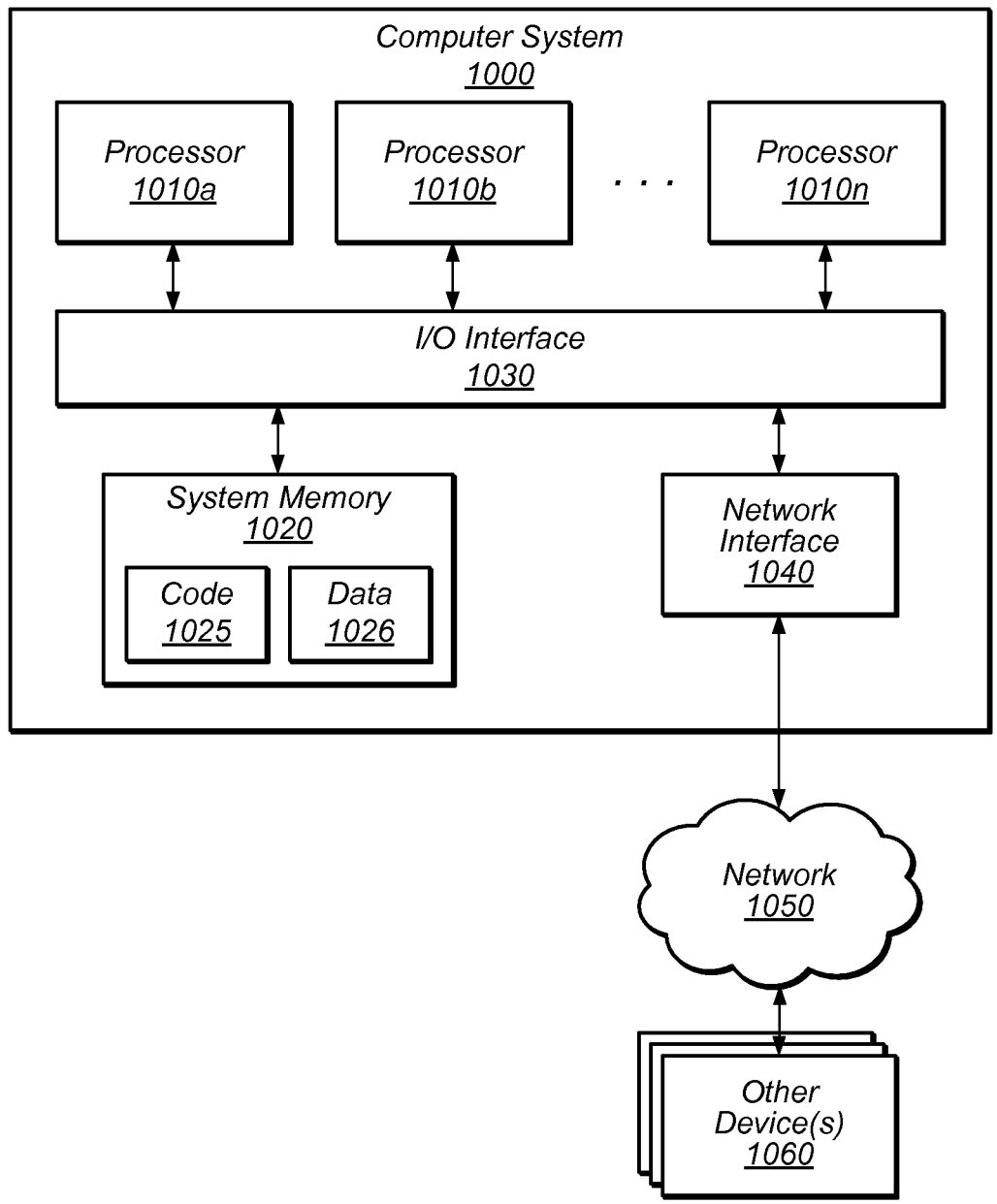
FIG. 10 illustrates a block diagram of one embodiment of a computer system that supports efficient data aggregation with sparse exponential histograms, according to one or more embodiments as described herein.

FIG. 10 illustrates a block diagram of one embodiment of a computer system that supports performance data aggregation and generation of sparse exponential histograms, according to one or more embodiments as described herein.

It is contemplated that in some embodiments, any of the methods, techniques or components described herein may be implemented as instructions and data capable of being stored or conveyed via a computer-accessible medium. Such methods or techniques may include, for example and without limitation, various methods of generating sparse exponential histograms as described herein. Such instructions may be executed to perform specific computational functions tailored to specific purposes (e.g., monitoring performance metrics of a network-based services system; logging data corresponding to the monitored performance metrics; storing, retrieving, modifying, deleting, and/or otherwise accessing data, etc.) as well as higher-order functions such as operating system functionality, virtualization functionality, network communications functionality, application functionality, storage system functionality, and/or any other suitable functions.

One example embodiment of a computer system that includes computer-accessible media and that supports sparse exponential histogram representations, as described herein, is illustrated in FIG. 10. In various embodiments, the functionality of any of the various modules or methods described herein may be implemented by one or several instances of computer system 1000. For example, multiple computing nodes may implement network-based service system that supports multiple clients, any or all of which may comprise instances of computer 1000. In particular, it is noted that different elements of the system described herein may be implemented by different computer systems 1000. For example, a network-based services system that provides the functionality described herein may be implemented on multiple computer systems 1000 in geographically different locations.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030. In various embodiments, computer system 1000 may be a uni-processor system including one processor 1010, or a multiprocessor system including several processors 1010 (e.g., two, four, eight, or another suitable number). Processors 1010 may be any suitable processor capable of executing instructions. For example, in various embodiments processors 1010 may be a general-purpose or embedded processor implementing any of a variety of instruction set architectures (ISAs), such as the x86, PowerPC™, SPARC™, or MIPS™ ISAs, or any other suitable ISA. In multiprocessor systems, each of processors 1010 may commonly, but not necessarily, implement the same ISA.

System memory 1020 may be configured to store instructions (e.g., code 1025) and data (e.g., in data store 1022) accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, instructions and data implementing desired functions, methods or techniques (such as functionality for logging metrics, for performing various operations to store, retrieve, modify, delete, and/or for auditing logs), are shown stored within system memory 1020 as code 1025. It is noted that in some embodiments, code 1025 may include instructions and data implementing desired functions that are not directly executable by processor 1010 but are represented or encoded in an abstract form that is translatable to instructions that are directly executable by processor 1010. For example, code 1025 may include instructions specified in an ISA that may be emulated by processor 1010, or by other code 1025 executable on processor 1010. Alternatively, code 1025 may include instructions, procedures or statements implemented in an abstract programming language that may be compiled or interpreted in the course of execution. As non-limiting examples, code 1025 may include code specified in a procedural or object-oriented programming language such as C or C++, a scripting language such as Perl, a markup language such as HTML or XML, or any other suitable language. In some embodiments, data (e.g., logs, billing records) may be stored in a data store 1022 within system memory 1020.

In one embodiment, I/O interface 1030 may be configured to coordinate I/O traffic between processor 1010, system memory 1020, and any peripheral devices in the device, including network interface 1040 or other peripheral interfaces. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. Also, in some embodiments some or all of the functionality of I/O interface 1030, such as an interface to system memory 1020, may be incorporated directly into processor 1010.

Network interface 1040 may be configured to allow data to be exchanged between computer system 1000 and other devices attached to a network (not shown), such as other computer systems, for example. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

In some embodiments, system memory 1020 may include a non-transitory, computer-accessible storage medium configured to store instructions and data as described above. However, in other embodiments, instructions and/or data may be received, sent or stored upon different types of computer-accessible storage media. Generally speaking, a computer-accessible storage medium may include storage media or memory media such as magnetic or optical media, e.g., disk or CD/DVD-ROM coupled to computer system 1000 via I/O interface 1030. A computer-accessible storage medium may also include any volatile or non-volatile storage media such as RAM (e.g. SDRAM, DDR SDRAM, RDRAM, SRAM, etc.), ROM, etc, that may be included in some embodiments of computer system 1000 as system memory 1020 or another type of memory. A computer-accessible storage medium may generally be accessible via transmission media or signals such as electrical, electromagnetic, or digital signals, conveyed via a communication medium such as a network and/or a wireless link that may be implemented via network interface 1040.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:
1. A system, comprising:
  a network-based service implemented by a plurality of computers, wherein the network-based service is configured to provide one or more services to a plurality of clients over a network;
  a performance monitor implemented on one or more computers configured to:
    monitor one or more dimensions of the network-based service with regard to one or more performance metrics, wherein each dimension comprises a predetermined portion of the plurality of computers, and wherein each performance metric represents an aggregate performance of a respective portion of computers of a respective dimension with respect to the network-based service processing one or more requests; and
    record the one or more performance metrics of the network-based service as performance data; and
  a performance data aggregator implemented on one or more computers configured to:

parse the performance data for at least one particular performance metric of the one or more performance metrics and at least one particular dimension of the one or more dimensions;

create a histogram representation data structure corresponding to a sparse exponential histogram representation of the parsed performance data, wherein empty buckets of the sparse exponential histogram representation are omitted in the histogram representation data structure; and transmit or store the histogram representation data structure for subsequent analysis.

2. The system of claim 1, wherein the network-based service is one of a plurality of network-based services implemented by the system, wherein each service comprises:

one or more local performance monitors; and one or more sparse exponential histogram generators configured to receive performance data for the service and generate a sparse exponential histogram representation of the performance data.

3. The system of claim 2, wherein the performance data aggregator is a system level aggregator configured to:

receive the performance data for each of the plurality of network-based services, wherein the performance data is received in sparse exponential histogram representations;

aggregate the performance data according to a schema; and store the aggregated performance data in one or more sparse exponential histogram representation data structures for subsequent analysis.

4. The system of claim 1, wherein each respective predetermined portion for the one or more dimensions comprises one or more of: part of one or more of the plurality of computers executing a particular process, one or more CPUs of the plurality of computers, one or more local hosts of the plurality of computers, computers of the plurality of computers that are located in a particular data center, or all of the plurality of computers for the network-based service.

5. The system of claim 1, wherein the histogram representation data structure comprises a plurality of frequency counts for each of a plurality of buckets, wherein each bucket corresponds to a range of performance data values, wherein the range for each bucket increases exponentially for each subsequent bucket, wherein each frequency count indicates a number of occurrences of performance data values within the range for the corresponding bucket, wherein at least one bucket of the plurality of buckets has a zero frequency count, and wherein the histogram representation data structure does not include representation of the at least one bucket.

6. A system, comprising:

one or more computers implementing a performance monitor configured to:

monitor one or more dimensions of a computer-based system with regard to one or more performance metrics, wherein each dimension comprises a predetermined portion of the computer-based system, and wherein each performance metric represents an aggregate performance of a respective predetermined portion of the computer-based system of a respective dimension with respect to the computer-based system processing one or more requests; and record the one or more performance metrics as performance data;

one or more computers implementing a performance data aggregator configured to:

parse the performance data based on at least one of the one or more performance metrics and the one or more dimensions;

create a histogram representation data structure corresponding to a sparse exponential histogram representation of the parsed performance data, wherein empty buckets of the sparse exponential histogram representation are omitted in the histogram representation data structure; and transmit or store the histogram representation data structure for subsequent analysis.

7. The system of claim 6, further comprising:

a plurality of network-based services each implemented by a plurality of computers, wherein each network-based service comprises:

one or more local performance monitors; and one or more sparse exponential histogram generators configured to receive performance data for the network-based service and generate a sparse exponential histogram representation of the performance data.

8. The system of claim 7, wherein the performance data aggregator is a system level aggregator configured to:

receive the performance data for each of the plurality of services, wherein the performance data is received in sparse exponential histogram representations;

aggregate the performance data according to a schema; and store the aggregated performance data in one or more histogram representation data structures for subsequent analysis.

9. The system of claim 8, wherein the system level aggregator is further configured to:

retrieve a plurality of the stored histogram representation data structures; and aggregate the retrieved plurality of the histogram representation data structures according to a stored schema or as specified by user input.

10. The system of claim 6, further comprising:

one or more network-based services each implemented by a plurality of computers, wherein the one or more network-based services provide one or more compute or storage services to a plurality of clients external to the system over a network;

wherein the performance data aggregator is configured to aggregate performance data as sparse exponential histograms for the one or more network-based services; and wherein the performance data aggregator is configured to provide a data aggregation service to the plurality of clients, wherein the data aggregation service is configured to:

receive data from one of the plurality of clients;

generate one or more histogram representation data structures corresponding to sparse exponential histogram representations of the data; and return or store the one or more histogram representation data structures.

11. The system of claim 6, wherein each respective predetermined portion for the one or more dimensions comprises one or more of: part of the computer-based system executing a particular process, one or more CPUs of the computer-based system, one or more local hosts of the computer-based system, computers of the computer-based system that are located in a particular data center, or computers of the network-based service implemented by the computer-based system.

12. The system of claim 6, wherein the histogram representation data structure comprises a plurality of frequency counts for each a plurality of buckets,
 wherein each bucket corresponds to a range of performance data values, wherein the range for each bucket increases exponentially for each subsequent bucket,
 wherein each frequency count indicates a number of occurrences of performance data values within the range for the corresponding bucket.

13. A method, comprising:
 receiving performance data from a performance monitor, wherein the performance data describes performance of one or more dimensions of a computer-based system with regard to one or more performance metrics, wherein the computer-based system implements at least a portion of a network-based service, wherein each dimension comprises a predetermined portion of the computer-based system, and wherein each performance metric represents an aggregate performance of a respective predetermined portion of the computer-based system of a respective dimension with respect to the computer-based system processing one or more requests;
 parsing the performance data based on at least one of the one or more performance metrics and the one or more dimensions;
 creating a histogram representation data structure corresponding to a sparse exponential histogram representation of the parsed performance data, wherein empty buckets of the sparse exponential histogram representation are omitted in the histogram representation data structure; and
 transmitting or storing the histogram representation data structure for subsequent analysis.

14. The method of claim 13, further comprising:
 receiving the performance data for each of a plurality of network-based services, wherein the performance data is received in sparse exponential histogram representations;
 aggregating the performance data according to a schema; and
 storing the aggregated performance data in one or more histogram representation data structures for subsequent analysis.

15. The method of claim 14, wherein storing the aggregated performance data in one or more histogram representation data structures for subsequent analysis further comprises:
 retrieving a plurality of the stored histogram representation data structures; and
 aggregating the retrieved plurality of the stored histogram representation data structures according to a stored schema or as specified by user input.

16. The method of claim 13, further comprising:
 monitoring the one or more performance metrics with one or more local performance monitors;
 receiving performance data from the one or more local performance monitors; and
 generating a sparse exponential histogram representation of the performance data.

17. The method of claim 13, wherein each respective predetermined portion for the one or more dimensions comprises one or more of: part of the computer-based system executing a particular process, one or more CPUs of the computer-based system, a one or more local hosts of the computer-based system, computers of the computer-based system that are located in a particular data center, or computers of the network-based service implemented by the computer-based system.

18. The method of claim 13, wherein said creating a histogram representation data structure comprises determining a plurality of frequency counts for each of a plurality of buckets,
 wherein each bucket corresponds to a range of performance data values, wherein the range for each buckets increases exponentially for each subsequent bucket,
 wherein each frequency count indicates a number of occurrences of performance data values within the range for the corresponding bucket, and
 wherein the sparse exponential histogram representation does not include representation of buckets having a zero frequency count.

19. A non-transitory, computer-readable storage medium storing program instructions that when executed by one or more computers implement a performance data aggregator configured to:
 receive performance data from a performance monitor, wherein the performance data describes performance of one or more dimensions of a computer-based system with regard to one or more performance metrics, wherein the computer-based system implements at least a portion of a network-based service, wherein each dimension comprises a predetermined portion of the computer-based system, and wherein each performance metric represents an aggregate performance of a respective predetermined portion of the computer-based system of a respective dimension with respect to the computer-based system processing one or more requests;
 parse the performance data based on at least one of the one or more performance metrics and the one or more dimensions;
 create a histogram representation data structure corresponding to a sparse exponential histogram representation of the parsed performance data, wherein empty buckets of the sparse exponential histogram representation are omitted in the histogram representation data structure; and
 transmit or store the histogram representation data structure for subsequent analysis.

20. The non-transitory, computer-readable storage medium of claim 19, wherein said performance data aggregator is a system level aggregator configured to:
 receive the performance data for each of a plurality of network-based services, wherein the performance data is received in sparse exponential histogram representations;
 aggregate the performance data according to a schema; and
 store the aggregated performance data in one or more histogram representation data structures for subsequent analysis.

21. The non-transitory, computer-readable storage medium of claim 19, wherein the performance data aggregator is a local performance data aggregator configured to:
 monitor the one or more performance metrics with one or more local performance monitors;
 receive performance data from the one or more local performance monitors; and
 generate a histogram representation data structure corresponding to a sparse exponential histogram representation of the performance data, wherein empty buckets of the sparse exponential histogram representation are omitted in the histogram representation data structure.

22. The non-transitory, computer-readable storage medium of claim 19, wherein each respective predetermined portion for the one or more dimensions comprises one or more of: part of the computer-based system executing a particular process, one or more CPUs of the computer-based system, one or more local hosts of the computer-based system, computers of the computer-based system that are located in a particular data center, or computers of the network-based service implemented by the computer-based system.

23. The non-transitory, computer-readable storage medium of claim 19, wherein to create the histogram representation data structure, a sparse exponential histogram generator of the performance data aggregator is configured to determine a plurality of frequency counts for each of a plurality of buckets,
   wherein each bucket corresponds to a range of performance data values, wherein the range for each buckets increases exponentially for each subsequent bucket,
   wherein each frequency count indicates a number of occurrences of performance data values within the range for the corresponding bucket, and
   wherein the sparse exponential histogram representation does not include representation of buckets having a zero frequency count.

\* \* \* \* \*